United States Patent
Murashima

(10) Patent No.: US 10,116,275 B2
(45) Date of Patent: Oct. 30, 2018

(54) PHYSICAL QUANTITY DETECTION CIRCUIT, PHYSICAL QUANTITY DETECTION DEVICE, ELECTRONIC APPARATUS, AND VEHICLE

(71) Applicant: Seiko Epson Corporation, Tokyo (JP)

(72) Inventor: Noriyuki Murashima, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/646,376

(22) Filed: Jul. 11, 2017

(65) Prior Publication Data

US 2018/0019717 A1    Jan. 18, 2018

(30) Foreign Application Priority Data

Jul. 15, 2016    (JP) ................. 2016-140347

(51) Int. Cl.
| | |
|---|---|
| H03M 1/12 | (2006.01) |
| H03F 3/387 | (2006.01) |
| G01D 5/241 | (2006.01) |
| G11C 27/02 | (2006.01) |
| H03F 3/45 | (2006.01) |
| H03G 3/20 | (2006.01) |
| H03H 7/01 | (2006.01) |
| G01D 21/00 | (2006.01) |
| H03G 1/00 | (2006.01) |
| H03G 3/00 | (2006.01) |
| H03H 19/00 | (2006.01) |

(52) U.S. Cl.
CPC ........... *H03F 3/387* (2013.01); *G01D 5/2417* (2013.01); *G01D 21/00* (2013.01); *G11C 27/02* (2013.01); *G11C 27/026* (2013.01); *H03F 3/45475* (2013.01); *H03G 1/0094* (2013.01); *H03G 3/001* (2013.01); *H03G 3/20* (2013.01); *H03H 7/0138* (2013.01); *H03F 2203/45514* (2013.01); *H03H 19/004* (2013.01)

(58) Field of Classification Search
CPC ... H03F 3/387; H03F 3/45475; G01D 5/2417; H03G 3/20
USPC .................................................. 341/122, 155
See application file for complete search history.

(56) References Cited

U.S. PATENT DOCUMENTS

| | | | |
|---|---|---|---|
| 7,595,648 B2 | 9/2009 | Ungaretti et al. | |
| 9,214,949 B1 * | 12/2015 | Wu .................... | H02M 3/07 |

(Continued)

FOREIGN PATENT DOCUMENTS

| | | |
|---|---|---|
| JP | 2007-155729 A | 6/2007 |
| JP | 2010-505335 A | 2/2010 |

(Continued)

*Primary Examiner* — Brian Young
(74) *Attorney, Agent, or Firm* — Harness, Dickey & Pierce, P.L.C.

(57) ABSTRACT

A physical quantity detection device includes a switched capacitor filter circuit having a first sample-and-hold circuit adapted to sample and hold a first signal, which is based on an output signal of a physical quantity detection element, an amplifier circuit to which an output signal of the first sample-and-hold circuit is input, and a first switched capacitor circuit to which a first output signal of the amplifier circuit is input, wherein an output signal of the first switched capacitor circuit is input to the amplifier circuit, and an A/D conversion circuit adapted to perform an A/D conversion on an output signal of the switched capacitor filter circuit.

17 Claims, 10 Drawing Sheets

(56) References Cited

U.S. PATENT DOCUMENTS

| | | | |
|---|---|---|---|
| 9,411,987 B2* | 8/2016 | Alladi | G06G 7/186 |
| 9,413,377 B1* | 8/2016 | Chang | H03H 19/006 |
| 2007/0152682 A1 | 7/2007 | Ungaretti et al. | |

FOREIGN PATENT DOCUMENTS

| JP | 2015-135245 A | 7/2015 |
|---|---|---|
| WO | WO-2008-042015 A2 | 4/2008 |

* cited by examiner

PHYSICAL QUANTITY DETECTION CIRCUIT, PHYSICAL QUANTITY DETECTION DEVICE, ELECTRONIC APPARATUS, AND VEHICLE

BACKGROUND

1. Technical Field

The present invention relates to a physical quantity detection circuit, a physical quantity detection device, an electronic apparatus, and a vehicle.

2. Related Art

At present, there are used physical quantity detection devices capable of detecting a variety of physical quantities, such as an acceleration sensor for detecting acceleration and a gyro sensor for detecting angular velocity, are widely used in a variety of systems and electronic apparatuses. For example, in JP-A-2015-135245, there is disclosed a physical quantity detection device configured by connecting a physical quantity detection circuit to a differential capacitive sensor, wherein the physical quantity detection circuit is provided with a QV amplifier, a programmable-gain amplifier (PGA), and an analog-digital converter (ADC).

In the physical quantity detection device, which performs analog processing on an analog signal output by the physical quantity detection element, and then converts the result into a digital signal using the ADC as in the case of the physical quantity detection device described in JP-A-2015-135245, it is necessary to make the drive frequency of the physical quantity detection element and the sampling frequency of the ADC coincide with each other, or to perform the conversion into a DC signal with a sample-and-hold circuit using the drive frequency. In the case of making the drive frequency and the sampling frequency of the ADC coincide with each other, an anti-aliasing filter cannot be provided, and therefore, reduction of noise is difficult due to the aliasing noise caused by the sampling in the ADC. Further, in the case of disposing the sample-and-hold circuit and the anti-aliasing filter in the anterior stage of the ADC, there occurs the aliasing noise due to the sample-and-hold circuit. Further, the anti-aliasing filter cannot be made larger in view of the circuit speed and the circuit area, and therefore, the reduction of noise is difficult.

SUMMARY

An advantage of some aspects of the invention is to provide a physical quantity detection circuit and a physical quantity detection device capable of reducing the noise using a sample-and-hold circuit and a switched capacitor filter circuit. Another advantage of some aspects of the invention is to provide an electronic apparatus and a vehicle using the physical quantity detection device.

The invention can be implemented as the following forms or application examples.

APPLICATION EXAMPLE 1

A physical quantity detection circuit according to this application example includes a switched capacitor filter circuit having a first sample-and-hold circuit adapted to sample and hold a first signal, which is based on an output signal of a physical quantity detection element, an amplifier circuit to which an output signal of the first sample-and-hold circuit is input, and a first switched capacitor circuit to which a first output signal of the amplifier circuit is input, wherein an output signal of the first switched capacitor circuit is input to the amplifier circuit, and an A/D conversion circuit adapted to perform an A/D conversion on an output signal of the switched capacitor filter circuit.

In the physical quantity detection circuit according to this application example, the switched capacitor filter circuit functions as an anti-aliasing filter in the anterior stage of the A/D conversion circuit due to the first switched capacitor circuit. Further, since the output signal of the switched capacitor filter circuit becomes the signal approximate to the DC signal due to the first sample-and-hold circuit, the degree of freedom of the sampling timing by the A/D conversion circuit is high. Therefore, according to the physical quantity detection circuit related to the present application example, it is possible to increase the frequency for driving the physical quantity detection element without changing the sampling frequency with which the A/D conversion circuit samples the output signal of the switched capacitor filter circuit, and thus, the reduction of noise can be achieved.

APPLICATION EXAMPLE 2

In the physical quantity detection circuit according to the application example described above, the amplifier circuit may include a first chopping circuit to which an output signal of the first sample-and-hold circuit is input, an operational amplifier to which an output signal of the first chopping circuit is input, and a second chopping circuit to which an output signal of the operational amplifier is input.

In the physical quantity detection circuit according to this application example, the signal component in the vicinity of the DC component included in the output signal of the first sample-and-hold circuit is converted by the first chopping circuit into the signal component in the vicinity of the chopping frequency. Further, the signal component (the signal component converted by the first chopping circuit) in the vicinity of the chopping frequency included in the output signal of the operational amplifier is restored by the second chopping circuit to the signal component in the vicinity of the DC component, and the noise component (the 1/f noise generated by the operation of the operational amplifier) included in the output signal of the operational amplifier is converted by the second chopping circuit into the noise component in the vicinity of the chopping frequency. Therefore, according to the physical quantity detection circuit related to the present embodiment, the noise component included in the output signal of the switched capacitor filter circuit is reduced, and thus, further reduction of noise can be achieved.

APPLICATION EXAMPLE 3

In the physical quantity detection circuit according to the application example described above, chopping frequencies in the first chopping circuit and the second chopping circuit may be equal to or lower than a half of a sampling frequency with which the A/D conversion circuit samples an output signal of the switched capacitor filter circuit.

In the physical quantity detection circuit according to this application example, in the output signal of the switched capacitor filter circuit, the noise component in the vicinity of the chopping frequency is raised. However, since the chopping frequency is equal to or lower than a half of the sampling frequency of the A/D conversion circuit, based on the sampling theorem, there is no chance that the noise component is folded back to the signal band in the vicinity of the DC due to the sampling by the A/D conversion circuit.

Therefore, according to the physical quantity detection circuit related to the present application example, the reduction of noise can be achieved.

APPLICATION EXAMPLE 4

In the physical quantity detection circuit according to the application example described above, the physical quantity detection circuit may further included a drive circuit adapted to generate a drive signal for driving the physical quantity detection element based on a first clock signal, the switched capacitor filter circuit may have a frequency divider circuit adapted to divide a frequency of the first clock signal to generate a second clock signal, and the first chopping circuit and the second chopping circuit may operate based on the second clock signal.

APPLICATION EXAMPLE 5

In the physical quantity detection circuit according to the application example described above, the A/D conversion circuit may perform the A/D conversion on a plurality of signals including an output signal of the switched capacitor filter circuit in a time-sharing manner.

In the physical quantity detection device according to this application example, since the output signal of the switched capacitor filter circuit becomes a signal approximate to the DC signal, the degree of freedom of the sampling timing by the A/D conversion circuit is high. Therefore, in the A/D conversion circuit, it is possible to perform the A/D conversion process of a plurality of signals including the output signal of the switched capacitor filter circuit in a time-sharing manner. Therefore, according to the present application example, it is possible to realize the physical quantity detection circuit capable of outputting the plurality of signals while preventing a dramatic increase in the circuit area.

APPLICATION EXAMPLE 6

In the physical quantity detection circuit according to the application example described above, the switched capacitor filter circuit may include a second sample-and-hold circuit adapted to sample and hold a second signal, which is based on the output signal of the physical quantity detection element, and a second switched capacitor circuit to which a second output signal of the amplifier circuit is input, an output signal of the first sample-and-hold circuit and an output signal of the second sample-and-hold circuit may be input to the amplifier circuit, and the amplifier circuit may operate on the first signal and the second signal in a differential manner.

In the physical quantity detection circuit according to this application example, the switched capacitor filter circuit functions as an anti-aliasing filter in the anterior stage of the A/D conversion circuit due to the first switched capacitor circuit and the second switched capacitor circuit. Further, since the output signal of the switched capacitor filter circuit becomes the signal approximate to the DC signal due to the first sample-and-hold circuit and the second switched capacitor circuit, the degree of freedom of the sampling timing by the A/D conversion circuit is high. Further, since the switched capacitor filter circuit operates on the first signal and the second signal input thereto in a differential manner, the common-mode noise included in the first signal and the second signal, and the common-mode noise generated in the signal processing are reduced. Therefore, according to the physical quantity detection circuit related to the present application example, it is possible to increase the frequency for driving the physical quantity detection element without changing the sampling frequency with which the A/D conversion circuit samples the output signal of the switched capacitor filter circuit, and thus, the reduction of noise can be achieved.

APPLICATION EXAMPLE 7

A physical quantity detection device according to this application example includes any one of the physical quantity detection circuits described above, and the physical quantity detection element.

According to this application example, in the physical quantity detection circuit, it is possible to increase the frequency for driving the physical quantity detection element without changing the sampling frequency with which the A/D conversion circuit samples the output signal of the switched capacitor filter circuit, and thus, the reduction of noise can be achieved.

APPLICATION EXAMPLE 8

An electronic apparatus according to this application example includes the physical quantity detection device described above.

APPLICATION EXAMPLE 9

A vehicle according to this application example includes the physical quantity detection device described above.

According to these application examples, since there is provided the physical quantity detection device capable of reducing noise, it is possible to realize, for example, an electronic apparatus and a vehicle high in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some preferred embodiments of the invention will hereinafter be described in detail using the accompanying drawings. It should be noted that the embodiments described below do not unreasonably limit the content of the invention as set forth in the appended claims. Further, all of the constituents described below are not necessarily essential elements of the invention.

The description will hereinafter be presented taking a physical quantity detection device (an acceleration detection device) for detecting the acceleration as the physical quantity for example.

1. Physical Quantity Detection Device

Figure 1:
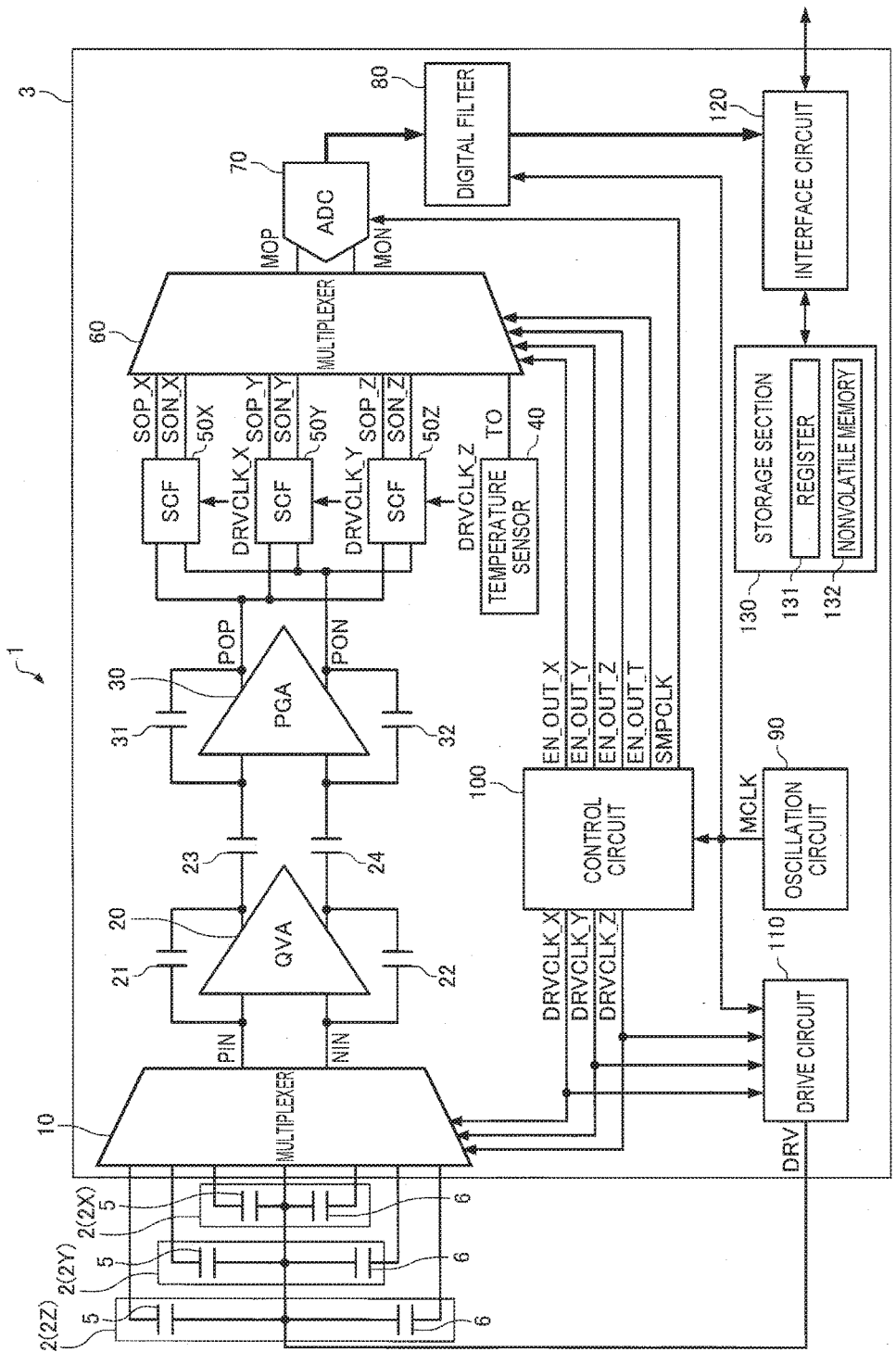
FIG. 1 is a functional block diagram of a physical quantity detection device according to an embodiment of the invention.

FIG. 1 is a functional block diagram of the physical quantity detection device according to the present embodiment. The physical quantity detection device 1 according to the present embodiment is configured including three physical quantity detection elements (sensor elements) 2 (2X, 2Y, 2Z) and a physical quantity detection circuit 3.

The three physical quantity detection elements 2 (2X, 2Y, 2Z) are each an element for outputting an analog signal corresponding to the physical quantity (the acceleration here) having been applied in the detection axis. The detection axis of the physical quantity detection element 2X is the X axis, the detection axis of the physical quantity detection element 2Y is the Y axis, and the detection axis of the physical quantity detection element 2Z is the Z axis. The X axis, the Y axis, and the Z axis cross each other, and are perpendicular to each other, for example.

Figure 2:
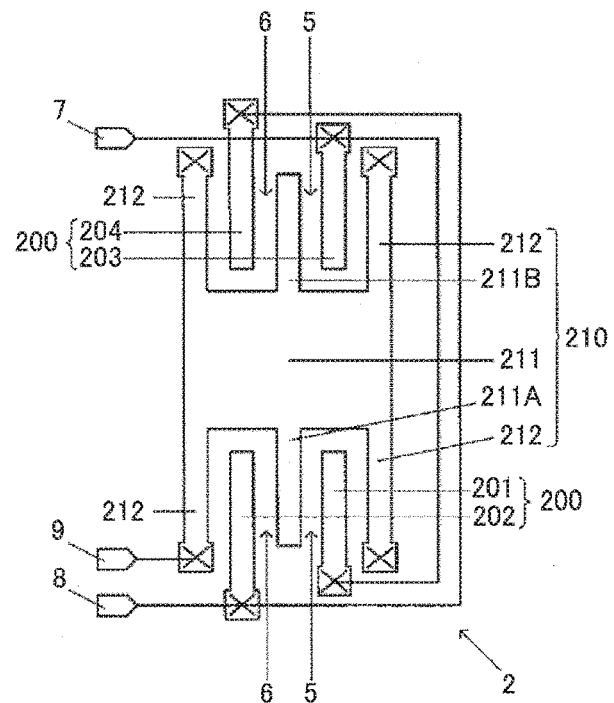
FIG. 2 is a diagram showing a structural example of a physical quantity detection element.

In the present embodiment, the physical quantity detection elements 2X, 2Y, and 2Z have the same structure, and each output a differential signal pair is output as an analog signal corresponding to the physical quantity. FIG. 2 is a diagram (a plan view) showing a structural example of each of the physical quantity detection elements 2 (2X, 2Y, and 2Z). As shown in FIG. 2, each of the physical quantity detection elements 2 includes a stationary section 200 and a movable section 210. The stationary section 200 is a member fixed to a substrate (not shown). The movable section 210 is a structure displaced in accordance with the acceleration, and includes a weight section 211 and a spring section 212. One end of the spring section 212 is fixed to the substrate, and the other end thereof is connected to the weight section 211. The weight section 211 is supported by the spring section 212.

Figure 3:
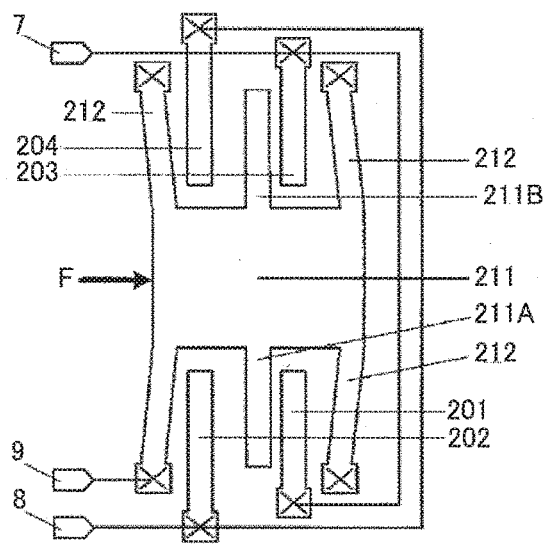
FIG. 3 is a diagram for explaining an action of the physical quantity detection element.

As shown in FIG. 3, when acceleration "a" is applied to each of the physical quantity detection elements 2, the force F acting on the weight section 211 having the mass m fulfills F=ma. Due to the force F, the spring section 212 is deformed, and the weight section 211 is displaced relatively to the stationary section 200.

The weight section 211 has a movable electrode 211A and a movable electrode 211B. The stationary section 200 has stationary electrodes 201 through 204. The movable electrode 211A is disposed between the stationary electrodes 201, 202, and the movable electrode 211B is disposed between the stationary electrodes 203, 204. The physical quantity detection elements 2 are each formed of MEMS (micro electro mechanical systems) using a semiconductor material such as Si (silicon), and the semiconductor processing technology.

Here, a pair constituted by the movable electrode 211A and the stationary electrode 201, and a pair constituted by the movable electrode 211B and the stationary electrode 203 are referred to as a first capacitance forming section 5. Similarly, a pair constituted by the movable electrode 211A and the stationary electrode 202, and a pair constituted by the movable electrode 211B and the stationary electrode 204 are referred to as a second capacitance forming section 6. Each of the physical quantity detection elements 2 includes a terminal 7 connected to an end of the first capacitance forming section 5, a terminal 8 connected to an end of the second capacitance forming section 6, and a terminal 9 connected to a common terminal to the first capacitance forming section 5 and the second capacitance forming section 6. When the acceleration "a" shown in FIG. 1 acts, the capacitance value of the first capacitance forming section 5 decreases while the capacitance value of the second capacitance forming section 6 increases. Therefore, when the acceleration "a" acts on the weight section 211 in the state in which the charges are supplied from the terminal 9 to the common terminal to the first capacitance forming section 5 and the second capacitance forming section 6, the charges (signals) respectively output from the one end of the first capacitance forming section 5 and the one end of the second capacitance forming section 6 via the terminals 7, 8 form a differential signal pair equal in absolute value to each other and opposite in sign to each other. As described above, the physical quantity detection element 2 shown in FIG. 2 is a differential capacitive sensor.

Going back to FIG. 1, the physical quantity detection circuit 3 is configured including a multiplexer 10, a QV amplifier (QVA) 20, capacitances 21 through 24, a programmable-gain amplifier (PGA) 30, capacitances 31, 32, a temperature sensor 40, switched capacitor filter circuits (SCF) 50X, 50Y, and 50Z, a multiplexer 60, an A/D conversion circuit (ADC) 70, a digital filter 80, an oscillation circuit 90, a control circuit 100, a drive circuit 110, an interface circuit 120, and a storage section 130. The physical quantity detection circuit 3 can also be, for example, a single-chip integrated circuit (IC). It should be noted that the physical quantity detection circuit 3 according to the present embodiment can have a configuration obtained by eliminating or modifying some of these constituents, or adding other constituents.

The oscillation circuit 90 outputs a clock signal MCLK. The oscillation circuit 90 can also be, for example, a CR oscillator or a ring oscillator.

The control circuit 100 generates a variety of clock signals (clock signals DRVCLK_X, DRVCLK_Y, DRVCLK_Z, and SMPCLK), and a variety of control signals (control signals EN_OUT_X, EN_OUT_Y, EN_OUT_Z, and EN_OUT_T) based on the clock signal MCLK.

The drive circuit 110 generates a drive signal DRV for driving the physical quantity detection elements 2X, 2Y, and 2Z based on the clock signal MCLK and the clock signals DRVCLK_X, DRVCLK_Y, and DRVCLK_Z (an example of a "first clock signal") with the frequency (drive frequency) fd. The drive signal DRV is a signal the same in frequency (the drive frequency fd) as the clock signals DRVCLK_X, DRVCLK_Y, and DRVCLK_Z, and is commonly applied to the terminals 9 (see FIG. 2 and FIG. 3) of the physical quantity detection elements 2X, 2Y, and 2Z.

The multiplexer 10 selects either one of the differential signal pairs respectively output by the physical quantity detection elements 2X, 2Y, and 2Z (or selects none of them) based on the clock signals DRVCLK_X, DRVCLK_Y, and DRVCLK_Z, which are activated (set to the high level, in the present embodiment) exclusively from each other to output the differential signal pair PIN, NIN. Specifically, in the case in which the clock signal DRVCLK_X is in the high level (the power supply voltage VDD), the multiplexer 10 selects the differential pair signals output from the terminals 7, 8 of the physical quantity detection element 2X to output them as the differential signal pair PIN, NIN. Further, in the case in which the clock signal DRVCLK_Y is in the high level, the multiplexer 10 selects the differential pair signals output from the terminals 7, 8 of the physical quantity detection element 2Y to output them as the differential signal pair PIN, NIN. Further, in the case in which the clock signal DRVCLK_Z is in the high level, the multiplexer 10 selects the differential pair signals output from the terminals 7, 8 of the physical quantity detection element 2Z to output them as the differential signal pair PIN, NIN. Further, in the case in which all of the clock signals DRVCLK_X, DRVCLK_Y, and DRVCLK_Z are in the low level (the power supply voltage VSS (e.g., 0 V)), the multiplexer 10 outputs the differential signal pair PIN, NIN both in a reference voltage VCOM (e.g., VDD/2).

Figure 4:
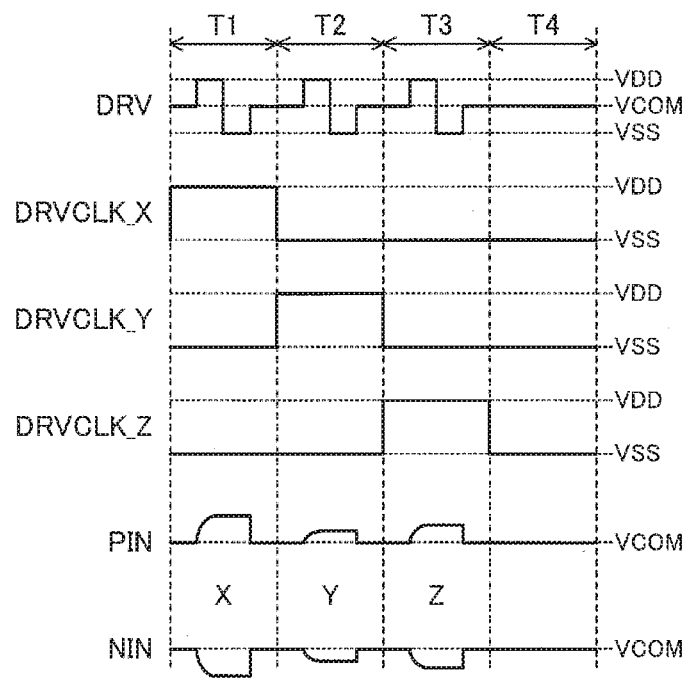
FIG. 4 is a diagram showing an example of signal waveforms in the embodiment.

FIG. 4 shows an example of the waveforms of the drive signal DRV, the clock signals DRVCLK_X, DRVCLK_Y, and DRVCLK_Z, and the differential signal pair PIN, NIN in the present embodiment. For example, the periods T1 through T4 are each a period corresponding to N cycles (e.g., one cycle) of the clock signal MCLK. In the periods T1, T2, and T3, the voltage of the drive signal DRV periodically changes in the order of VCOM (=VDD/2) ⇒ VDD ⇒ VSS (=0 V) ⇒ VCOM, and in the period T4, the voltage of the drive signal DRV is VCOM.

In the periods T1 through T3, the physical quantity detection elements 2X, 2Y, and 2Z are driven commonly with the drive signal DRV, and the differential signal pair, which corresponds to the physical quantity applied in each of the X axis, the Y axis, and the Z axis, is output from the terminals 7, 8 of the corresponding one of the physical quantity detection elements 2X, 2Y, and 2Z. Further, in the period T1, since the clock signal DRVCLK_X is in the high level, the differential pair signals output from the physical quantity detection element 2X are selected as the differential signal pair PIN, NIN. Further, in the period T2, since the clock signal DRVCLK_Y is in the high level, the differential pair signals output from the physical quantity detection element 2Y are selected as the differential signal pair PIN, NIN. Further, in the period T3, since the clock signal DRVCLK_Z is in the high level, the differential pair signals output from the physical quantity detection element 2Z are selected as the differential signal pair PIN, NIN. Further, in the period T4, since all of the clock signals DRVCLK_X, DRVCLK_Y, and DRVCLK_Z are in the low level, both signals of the differential signal pair PIN, NIN are set to VCOM.

Going back to FIG. 1, the QV amplifier 20 converts the differential signal pair PIN, NIN of the charge output from the multiplexer 10 is converted into a differential signal pair of the voltage. The capacitances 21, 22 are feedback capacitances of the QV amplifier 20.

The differential signal pair output from the QV amplifier 20 is input to the programmable-gain amplifier 30, through the capacitances 21, 22 and the programmable-gain amplifier 30 outputs differential signal pair POP, PON obtained by amplifying the differential signal pair output from the QV amplifier 20.

To the switched capacitor filter circuits 50X, 50Y, and 50Z, there is commonly input the differential signal pair POP, PON output from the programmable-gain amplifier 30. Then, based on the clock signal DRVCLK_X, the switched capacitor filter circuit 50X samples and then holds a signal based on the output signal of the physical quantity detection element 2X included in the differential signal pair POP, PON, and performs a filtering process on the signal to output differential signal pair SOP_X, SON_X. Further, based on the clock signal DRVCLK_Y, the switched capacitor filter circuit 50Y samples and then holds a signal based on the output signal of the physical quantity detection element 2Y included in the differential signal pair POP, PON, and performs a filtering process on the signal to output differential signal pair SOP_Y, SON_Y. Further, based on the clock signal DRVCLK_Z, the switched capacitor filter circuit 50Z samples and then holds a signal based on the output signal of the physical quantity detection element 2Z included in the differential signal pair POP, PON, and performs a filtering process on the signal to output differential signal pair SOP_Z, SON_Z. In the present embodiment, the switched capacitor filter circuits 50X, 50Y, 50Z are realized with the same circuit configuration.

Figure 5:
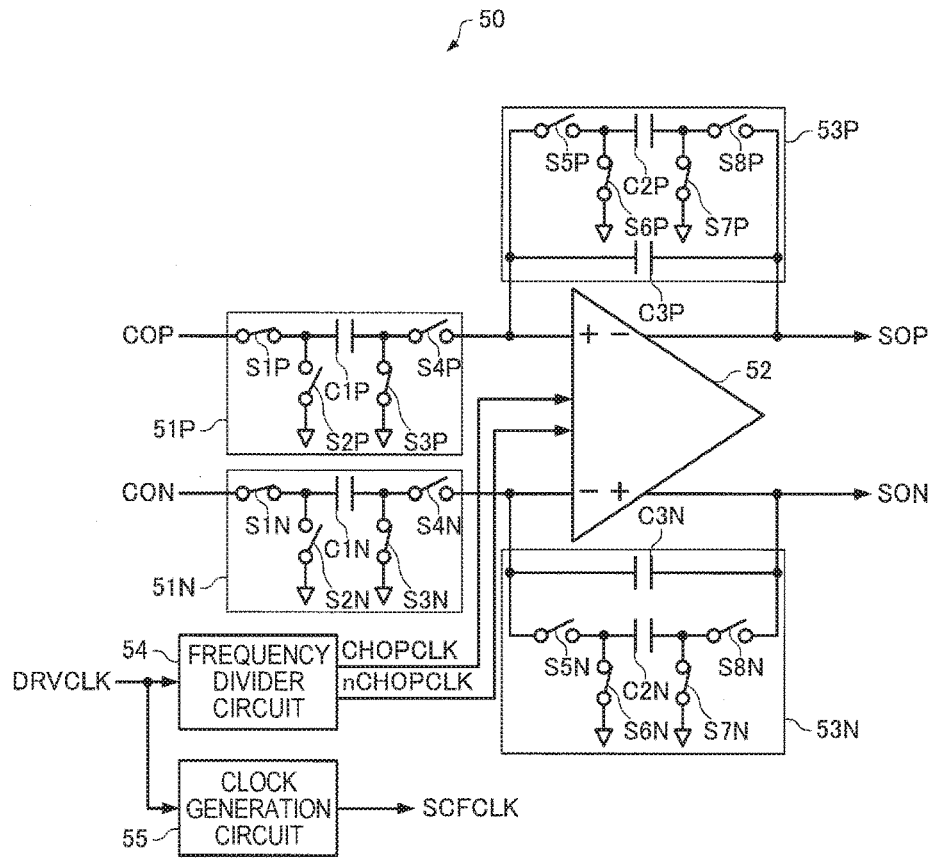
FIG. 5 is a diagram showing a configuration example of a switched capacitor filter circuit.

FIG. 5 is a diagram showing a configuration example of each of the switched capacitor filter circuits 50 (50X, 50Y, and 50Z). As shown in FIG. 5, the switched capacitor filter circuits 50 are each configured including sample-and-hold circuits 51P, 51N, an amplifier circuit 52, switched capacitor circuits 53P, 53N, a frequency divider circuit 54, and a clock generation circuit 55.

The frequency divider circuit 54 divides the frequency (by M) of the clock signal DRVCLK (DRVCLK_X, DRVCLK_Y, or DRVCLK_Z) to generate and then output a clock signal CHOPCLK (an example of a "second clock signal"). Further, the frequency divider circuit 54 generates and then outputs a clock signal nCHOPCLK reversed in high level and low level from the clock signal CHOPCLK. Therefore, assuming the division ratio of the frequency divider circuit 54 as M, the frequency (a chopping frequency fc) of the clock signals CHOPCLK, nCHOPCLK is 1/M of the frequency (the drive frequency fd) of the clock signal DRVCLK.

The clock generation circuit 55 generates and then outputs a clock signal SCFCLK based on the clock signal DRVCLK (DRVCLK_X, DRVCLK_Y, or DRVCLK_Z). In the present embodiment, the clock signal SCFCLK is a signal having the same frequency (the drive frequency fd) as the clock signal DRVCLK, and narrower in high-pulse width than the clock signal DRVCLK.

The sample-and-hold circuit 51P (an example of a "first sample-and-hold circuit") samples and holds the signal POP (an example of a "first signal"), which is a signal based on the output signal of corresponding one of the physical quantity detection elements 2X, 2Y, and 2Z, and is output from the programmable-gain amplifier 30. As shown in FIG. 5, the sample-and-hold circuit 51P is configured including switches S1P, S2P, S3P, and S4P, and a capacitance C1P. The switches S1P, S3P are set to a conductive state when the clock signal SCFCLK is in the high level, and are set to a nonconductive state when the clock signal SCFCLK is in the low level. Further, the switches S2P, S4P are set to the conductive state when the clock signal SCFCLK is in the low level, and are set to the nonconductive state when the clock signal SCFCLK is in the high level. The sample-and-hold circuit 51P samples the signal POP output from the programmable-gain amplifier 30 in the period in which the clock signal SCFCLK is in the high level, and holds the signal POP thus sampled during the period in which the clock signal SCFCLK is in the low level.

The sample-and-hold circuit 51N (an example of a "second sample-and-hold circuit") samples and holds the signal PON (an example of a "second signal"), which is a signal based on the output signal of corresponding one of the physical quantity detection elements 2X, 2Y, and 2Z, and is output from the programmable-gain amplifier 30. As shown in FIG. 5, the sample-and-hold circuit 51N is configured including switches S1N, S2N, S3N, and S4N, and a capacitance C1N. The switches S1N, S3N are set to the conductive state when the clock signal SCFCLK is in the high level, and are set to the nonconductive state when the clock signal SCFCLK is in the low level. Further, the switches S2N, S4N are set to the conductive state when the clock signal SCFCLK is in the low level, and are set to the nonconductive state when the clock signal SCFCLK is in the high level. The sample-and-hold circuit 51N samples the signal PON output from the programmable-gain amplifier 30 in the period in which the clock signal SCFCLK is in the high level, and holds the signal PON thus sampled during the period in which the clock signal SCFCLK is in the low level.

In the amplifier circuit 52, the output signal of the sample-and-hold circuit 51P and the output signal of the switched capacitor circuit 53P are input to the non-inverting input terminal (+ input terminal), and the output signal of the sample-and-hold circuit 51N and the output signal of the switched capacitor circuit 53N are input to the inverting input terminal (− input terminal). The amplifier circuit 52 inverting-amplifies the differential signal pair input to the amplifier circuit 52, and at the same time performs chopping based on the clock signals CHOPCLK, nCHOPCLK to output differential signal pair SOP, SON.

Figure 6:
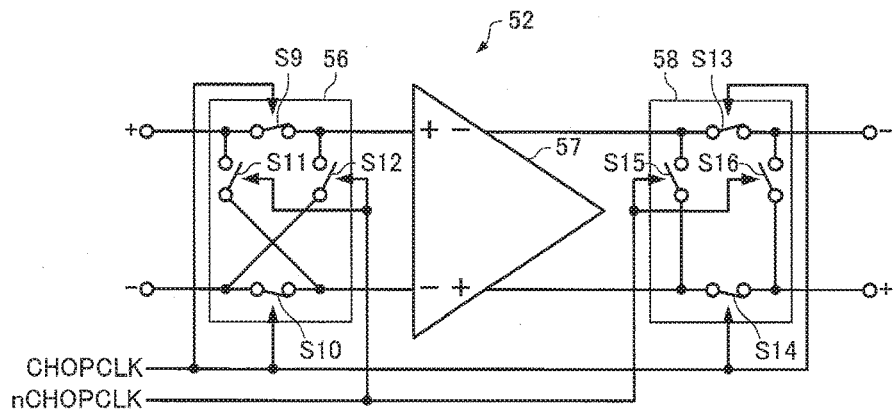
FIG. 6 is a diagram showing a configuration example of an amplifier circuit.

FIG. 6 is a diagram showing a configuration example of the amplifier circuit 52. As shown in FIG. 6, the amplifier circuit 52 is configured including a chopping circuit 56, an operational amplifier 57, and a chopping circuit 58.

The output signals (the differential signal pair) of the sample-and-hold circuits 51P, 51N are input to the chopping circuit 56 (an example of a "first chopping circuit"), and the chopping circuit 56 operates based on the clock signals CHOPCLK, nCHOPCLK to output a differential signal pair obtained by chopping the differential signal pair thus input. As shown in FIG. 6, the chopping circuit 56 is configured including four switches S9, S10, S11, and S12. The switches S9, S10 are set to the conductive state when the clock signal CHOPCLK is in the high level, and are set to the nonconductive state when the clock signal CHOPCLK is in the low level. Further, the switches S11, S12 are set to the conductive state when the clock signal nCHOPCLK is in the high level, and are set to the nonconductive state when the clock signal nCHOPCLK is in the low level. Here, the clock signal nCHOPCLK is a signal reversed in high level and low level from the clock signal CHOPCLK, and therefore, when the clock signal CHOPCLK is in the high level, the clock signal nCHOPCLK becomes in the low level, and when the clock signal CHOPCLK is in the low level, the clock signal nCHOPCLK becomes in the high level. Further, since the frequency (the chopping frequency) fc of the clock signals CHOPCLK, nCHOPCLK is 1/M of the frequency (the drive frequency fd) of the clock signal DRVCLK as described above, the state in which the clock signal CHOPCLK is in the high level and the clock signal nCHOPCLK is in the low level, and the state in which the clock signal CHOPCLK is in the low level and the clock signal nCHOPCLK is in the high level are repeated every period (period in which the periods T1 through T4 shown in FIG. 4 are repeated for M/2 times) corresponding to M/2 cycles of the clock signal DRVCLK.

Figure 7:
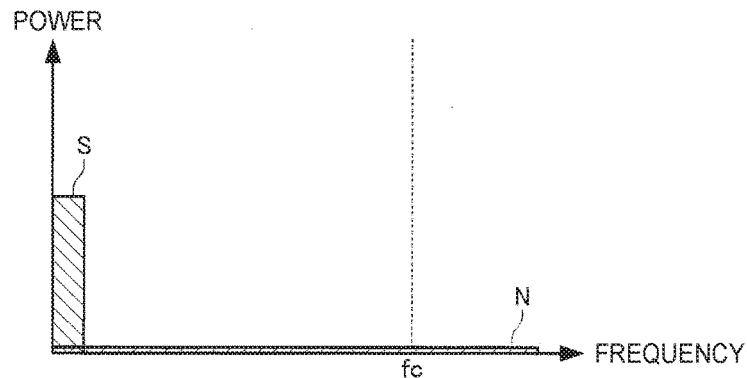
FIG. 7 is a diagram showing an example of the frequency spectrum of a differential signal pair input to a chopping circuit 56.
Figure 8:
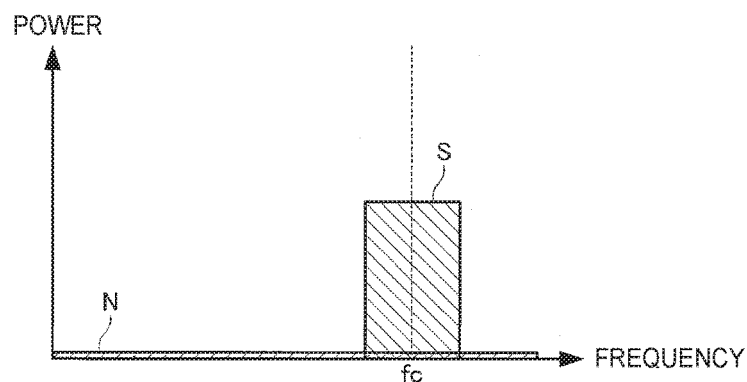
FIG. 8 is a diagram showing an example of the frequency spectrum of a differential signal pair output from the chopping circuit 56.

Therefore, the state in which the switches S9, S10 are set to the conductive state and the switches S11, S12 are set to the nonconductive state, and thus the differential signal pair input is directly output, and the state in which the switches S9, S10 are set to the nonconductive state and the switches S11, S12 are set to the conductive state, and thus the signals of the differential signal pair input are exchanged for each other and then output are repeated every period corresponding to M/2 cycles of the clock signal DRVCLK. As a result, the signal component in the vicinity of the DC component included in the differential signal pair input to the chopping circuit 56 is converted by the chopping circuit 56 into a signal component in the vicinity of the chopping frequency fc. FIG. 7 shows an example of the frequency spectrum of the differential signal pair input to the chopping circuit 56, and FIG. 8 shows an example of the frequency spectrum of the differential signal pair output from the chopping circuit 56. In FIG. 7 and FIG. 8, the horizontal axis represents the frequency, and the vertical axis represents the power. Further, the reference symbol S denotes the signal component included in the differential signal pair, and the reference symbol N denotes the noise component included in the differential signal pair.

Figure 9:
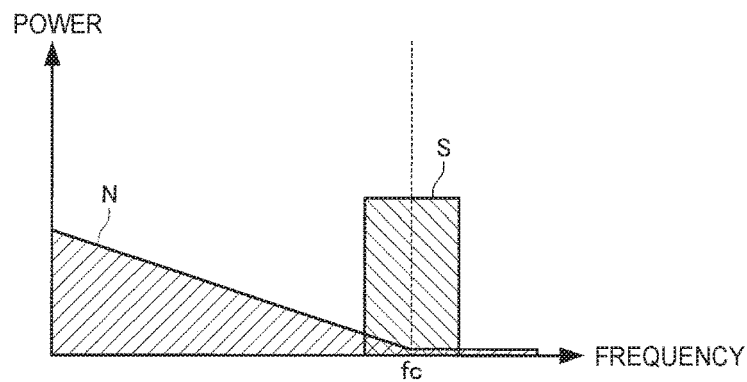
FIG. 9 is a diagram showing an example of the frequency spectrum of a differential signal pair output from an operational amplifier 57.

The output signal (differential signal pair) of the chopping circuit 56 is input to the operational amplifier 57, and the operational amplifier 57 inverting-amplifies the differential signal pair input to the operational amplifier 57, and then output the result. On the differential signal pair output from the operational amplifier 57, there is superimposed 1/f noise generated due to the operation of the operational amplifier 57. FIG. 9 shows an example of the frequency spectrum of the differential signal pair output from the operational amplifier 57. In FIG. 9, the horizontal axis represents the frequency, and the vertical axis represents the power. Further, the reference symbol S denotes the signal component included in the differential signal pair, and the reference symbol N denotes the noise component included in the differential signal pair.

The output signals (the differential signal pair) of the operational amplifier 57 are input to the chopping circuit 58 (an example of a "second chopping circuit"), and the chopping circuit 58 operates based on the clock signals CHOPCLK, nCHOPCLK to output a differential signal pair obtained by chopping the differential signal pair thus input. As shown in FIG. 6, the chopping circuit 58 is configured including four switches S13, S14, S15, and S16. The switches S13, S14 are set to the conductive state when the clock signal CHOPCLK is in the high level, and are set to the nonconductive state when the clock signal CHOPCLK is in the low level. Further, the switches S15, S16 are set to the conductive state when the clock signal nCHOPCLK is in the high level, and are set to the nonconductive state when the clock signal nCHOPCLK is in the low level. Further, since the frequency (the chopping frequency) fc of the clock signals CHOPCLK, nCHOPCLK is 1/M of the frequency (the drive frequency fd) of the clock signal DRVCLK as described above, the state in which the clock signal CHOP- CLK is in the high level and the clock signal nCHOPCLK is in the low level, and the state in which the clock signal CHOPCLK is in the low level and the clock signal nCHOPCLK is in the high level are repeated every period (period in which the periods T1 through T4 shown in FIG. 4 are repeated for M/2 times) corresponding to M/2 cycles of the clock signal DRVCLK.

Figure 10:
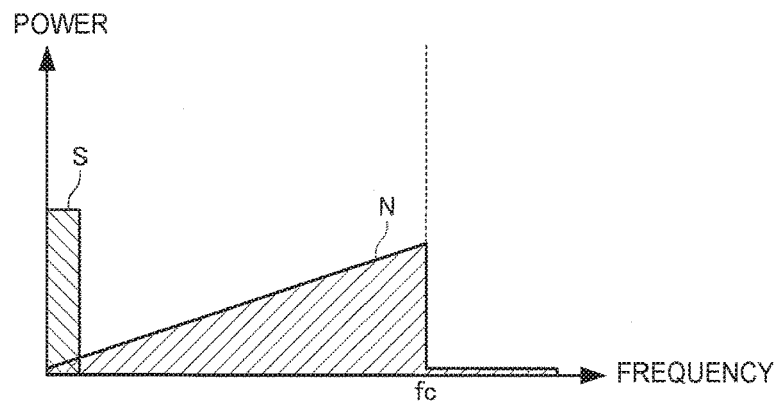
FIG. 10 is a diagram showing an example of the frequency spectrum of a differential signal pair output from a chopping circuit 58.

Therefore, the state in which the switches S13, S14 are set to the conductive state and the switches S15, S16 are set to the nonconductive state, and thus the differential signal pair input is directly output, and the state in which the switches S13, S14 are set to the nonconductive state and the switches S15, S16 are set to the conductive state, and thus the signals of the differential signal pair input are exchanged for each other and then output are repeated every period corresponding to M/2 cycles of the clock signal DRVCLK. As a result, the signal component in the vicinity of the chopping frequency fc included in the differential signal pair input to the chopping circuit 58 is restored by the chopping circuit 58 to the signal component in the vicinity of the DC component, and the noise component (1/f noise) included in the differential signal pair is converted into a noise component in the vicinity of the chopping frequency fc. FIG. 10 shows an example of the frequency spectrum of the differential signal pair output from the chopping circuit 58. In FIG. 10, the horizontal axis represents the frequency, and the vertical axis represents the power. Further, the reference symbol S denotes the signal component included in the differential signal pair, and the reference symbol N denotes the noise component included in the differential signal pair.

Then, the differential signal pair output from the chopping circuit 58 becomes the output signals (the differential signal pair SOP, SON) of the amplifier circuit 52. As described above, due to the chopping circuits 56, 58 disposed respectively in the anterior and posterior stages of the operational amplifier 57, it is possible to effectively reduce the noise generated by the operation of the operational amplifier 57, and included in the signal band in the vicinity of the DC component in the differential signal pair SOP, SON.

Going back to FIG. 5, to the switched capacitor circuit 53P (an example of a "first switched capacitor circuit"), there is input the output signal SOP (an example of a "first output signal of the amplifier circuit") output from the inverting output terminal (− output terminal) of the amplifier circuit 52. As shown in FIG. 5, the switched capacitor circuit 53P is configured including switches S5P, S6P, S7P, and S8P, and capacitances C2P, C3P. The switches S5P, S8P are set to the conductive state when the clock signal SCFCLK is in the low level, and are set to the nonconductive state when the clock signal SCFCLK is in the high level. Further, the switches S6P, S7P are set to the conductive state when the clock signal SCFCLK is in the high level, and are set to the nonconductive state when the clock signal SCFCLK is in the low level. The switched capacitor circuit 53P functions as a low-pass filter having a cutoff frequency determined by the frequency of the clock signal SCFCLK and the capacitance values of the capacitances C2P, C3P.

To the switched capacitor circuit 53N (an example of a "second switched capacitor circuit"), there is input the output signal SON (an example of a "second output signal of the amplifier circuit") output from the non-inverting output terminal (+ output terminal) of the amplifier circuit 52. As shown in FIG. 5, the switched capacitor circuit 53N is configured including switches S5N, S6N, S7N, and S8N, and capacitances C2N, C3N. The switches S5N, S8N are set to the conductive state when the clock signal SCFCLK is in the low level, and are set to the nonconductive state when the clock signal SCFCLK is in the high level. Further, the switches S6N, S7N are set to the conductive state when the clock signal SCFCLK is in the high level, and are set to the nonconductive state when the clock signal SCFCLK is in the low level. The switched capacitor circuit 53N functions as a low-pass filter having a cutoff frequency determined by the frequency of the clock signal SCFCLK and the capacitance values of the capacitances C2N, C3N.

The switched capacitor filter circuit 50 configured in such a manner operates in a differential manner on the signals (the differential signal pair POP, PON) output from the programmable-gain amplifier 30 based on the clock signal SCFCLK to output the differential signal pair SOP, SON. Further, the frequency of the clock signal SCFCLK is the same as the frequency (the drive frequency fd) of the clock signal DRVCLK, and is therefore equal to the update rate of the differential signal pair POP, PON output from the programmable-gain amplifier 30. Therefore, sampling of the differential signal pair POP, PON using the clock signal SCFCLK in the sample-and-hold circuits 51P, 51N fails to fulfill the sampling theorem. Therefore, in the present embodiment, the phase of the clock signal SCFCLK is adjusted so that the falling timing of the clock signal SCFCLK comes in the period in which the differential signal pair POP, PON keeps the peak value (see FIG. 11). Thus, in the case in which the peak value of the differential signal pair POP, PON varies by every cycle of the clock signal SCFCLK, namely in the case in which the variation in physical quantity (acceleration) applied to the physical quantity detection element 2 is extremely rapid, the filter operation due to the switched capacitor filter circuit 50 does not correctly work. However, normally, the period of the variation of the physical quantity (the acceleration) is sufficiently long compared to the period of the clock signal SCFCLK, and therefore, the filter process works correctly. Further, in the case in which the period of the variation of the physical quantity (the acceleration) is sufficiently long compared to the period of the clock signal SCFCLK, the period of the variation of the peak value of the differential signal pair POP, PON is also long, and therefore, the output signals of the sample-and-hold circuits 51P, 51N become signals approximate to the DC signal. Therefore, the differential signal pair SOP, SON output by the switched capacitor filter circuit 50 also becomes signals approximate to the DC signal.

Going back to FIG. 1, the temperature sensor 40 outputs a signal TO varying in voltage with the temperature. The temperature sensor 40 is adjusted so that, for example, the voltage of the signal TO at the reference temperature (e.g., +25° C.) becomes the reference voltage VCOM. The temperature sensor 40 can also be, for example, a circuit using the temperature characteristics of a bandgap reference circuit.

Based on the control signals EN_OUT_X, EN_OUT_Y, EN_OUT_Z, and EN_OUT_T activated (set to the high level, in the present embodiment) exclusively from each other, the multiplexer 60 selects either one of the differential signal pair SOP_X, SON_X output by the switched capacitor filter circuit 50X, the differential signal pair SOP_Y, SON_Y output by the switched capacitor filter circuit 50Y, the differential signal pair SOP_Z, SON_Z output by the switched capacitor filter circuit 50Z, and the output signal TO of the temperature sensor 40 (or selects none of them) to output the signal pair MOP, MON. Specifically, in the case in which the control signal EN_OUT_X is in the high level, the multiplexer 60 selects the differential signal pair SOP_X, SON_X and then outputs the differential signal pair SOP_X, SON_X as the differential signal pair MOP, MON. Further, in the case in which the control signal EN_OUT_Y is in the high level, the multiplexer 60 selects the differential signal pair SOP_Y, SON_Y and then outputs the differential signal pair SOP_Y, SON_Y as the differential signal pair MOP, MON. Further, in the case in which the control signal EN_OUT_Z is in the high level, the multiplexer 60 selects the differential signal pair SOP_Z, SON_Z and then outputs the differential signal pair SOP_Z, SON_N as the differential signal pair MOP, MON. Further, in the case in which the control signal EN_OUT_T is in the high level, the multiplexer 60 selects the output signal TO of the temperature sensor 40, and then outputs the signal pair of the signal TO and the reference voltage VCOM as the signal pair MOP, MON.

Based on the clock signal SMPCLK, the A/D conversion circuit 70 samples the signal pair MOP, MON (the differential signal pair SOP_X, SON_X, the differential signal pair SOP_Y, SON_Y, the differential signal pair SOP_Z, SON_Z, or the signal pair TO, VCOM) output by the multiplexer 60, and then converts the potential difference between the signal pair MOP, MON into a digital signal. The clock signal SMPCLK is the clock signal including one high pulse in each of the periods in which either one of the control signals EN_OUT_X, EN_OUT_Y, EN_OUT_Z, and EN_OUT_T. Further, the A/D conversion circuit 70 samples the signal pair MOP, MON (the differential signal pair SOP_X, SON_X output by the switched capacitor filter circuit 50X) output from the multiplexer 60 at the rising edge of the clock signal SMPCLK during the period in which the control signal EN_OUT_X is in the high level, and then converts the result into a digital signal. Further, the A/D conversion circuit 70 samples the signal pair MOP, MON (the differential signal pair SOP_Y, SON_Y output by the switched capacitor filter circuit 50Y) output from the multiplexer 60 at the rising edge of the clock signal SMPCLK during the period in which the control signal EN_OUT_Y is in the high level, and then converts the result into a digital signal. Further, the A/D conversion circuit 70 samples the signal pair MOP, MON (the differential signal pair SOP_Z, SON_Z output by the switched capacitor filter circuit 50Z) output from the multiplexer 60 at the rising edge of the clock signal SMPCLK during the period in which the control signal EN_OUT_Z is in the high level, and then converts the result into a digital signal. Further, the A/D conversion circuit 70 samples the signal pair MOP, MON (the signal pair of the output signal TO of the temperature sensor 40 and the reference voltage VCOM) output from the multiplexer 60 at the rising edge of the clock signal SMPCLK during the period in which the control signal EN_OUT_T is in the high level, and then converts the result into a digital signal.

As described above, in the periods T1 through T4, the A/D conversion circuit 70 samples the signal pair MOP, MON output from the multiplexer 60 a plurality of times (here, four times) and performs the A/D conversion in a time-sharing manner. In other words, the A/D conversion circuit 70 performs the A/D conversion on the plurality of signals including the output signals (the differential signal pair) of the switched capacitor filter circuits 50X, 50Y, and 50Z in a time-sharing manner. As described above, in the present embodiment, the differential signal pairs respectively output by the switched capacitor filter circuits 50X, 50Y, and 50Z are each the signals approximate to the DC signal, and the output signal TO of the temperature sensor 40 is also the signal approximate to the DC signal. Therefore, there is a little restriction in the selection timing of the signal in the multiplexer 60. In other words, the degree of freedom of the sampling timing of the A/D conversion circuit 70.

It should be noted that based on the sampling theorem, the signal components higher in frequency than a half of the sampling frequency fs (the frequency with which the A/D conversion circuit 70 samples the output signals of the switched capacitor filter circuits 50X, 50Y, and 50Z) in the output signals of the switched capacitor filter circuits 50X, 50Y, and 50Z are folded back to the frequency band in the vicinity of the DC due to the sampling in the A/D conversion circuit 70 to turn to the noise component. Therefore, the cutoff frequency of each of the switched capacitor filter circuits 50A, 50Y, and 50Z is set to be equal to or lower than a half of the sampling frequency fs so as to function as the sample-and-hold circuit for generating the signal approximate to the DC signal and at the same time function as the anti-aliasing filter for reducing the noise component caused by the sampling by the A/D conversion circuit 70.

Further, since the differential signal pair SOP_X, SON_X, the differential signal pair SOP_Y, SON_Y, and the differential signal pair SOP_Z, SON_Z respectively output from the switched capacitor filter circuits 50X, 50Y, and 50Z are high in noise component in the vicinity of the chopping frequency fc (see FIG. 10), the chopping frequency fc is set to be equal to or lower than a half of the sampling frequency fs so that the noise component is folded back to the signal band in the vicinity of the DC due to the sampling by the A/D conversion circuit 70.

The digital filter 80 performs the filtering process on the digital signal output from the A/D conversion circuit 70 based on the clock signal MCLK. Since the high-frequency noise generated by the A/D conversion process by the A/D conversion circuit 70 is superimposed on the digital signal output from the A/D conversion circuit 70, the digital filter functions as the low-pass filter for reducing the high-frequency noise.

Further, it is also possible for the digital filter 80 to further perform a process of correcting the temperature characteristic of the differential signal pairs respectively output from the switched capacitor filter circuits 50X, 50Y, and 50Z using the digital signal obtained by converting the output signal TO of the temperature sensor.

The interface circuit 120 is a circuit for communicating with an external device of the physical quantity detection device 1. Via the interface circuit 120, it is possible for the external device to perform reading of data from and writing of data to the storage section 130, and perform reading of the digital signal output from the digital filter 80, and so on. The interface circuit 120 can be, for example, the three-terminal or four-terminal SPI (Serial Peripheral Interface) interface circuit, or can be the two-terminal I²C (Inter-Integrated Circuit) interface circuit.

The storage section 130 has a register 131 and a nonvolatile memory 132. In the nonvolatile memory 132, there are stored a variety of types of information such as a variety of types of data (e.g., gain adjustment data of the programmable-gain amplifier 30, output adjustment data of the temperature sensor 40, the filter coefficient of the digital filter 80, and the temperature correction table) to the respective circuits included in the physical quantity detection circuit 3. The nonvolatile memory 132 can be formed of, for example, an MONOS (Metal Oxide Nitride Oxide Silicon) memory or an electrically erasable programmable read-only memory (EEPROM). Further, when powering on (when the power supply voltage rises from 0 V to the VDD) the physical quantity detection circuit 3, the variety of types of data stored in the nonvolatile memory 132 are transmitted to and then stored in the register 131, and then the variety of types of data stored in the register 131 are supplied to the respective circuits.

Figure 11:
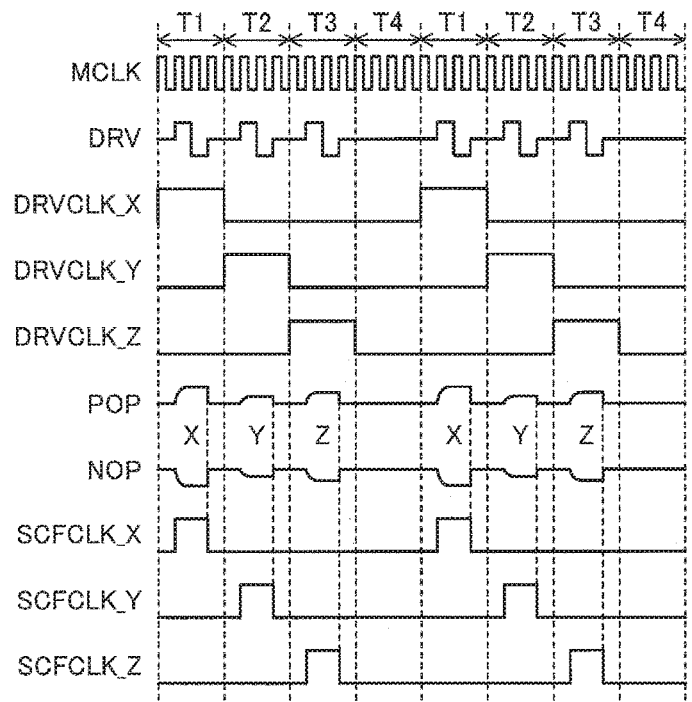
FIG. 11 is a diagram showing an example of signal waveforms of a variety of signals in a physical quantity detection circuit.
Figure 12:
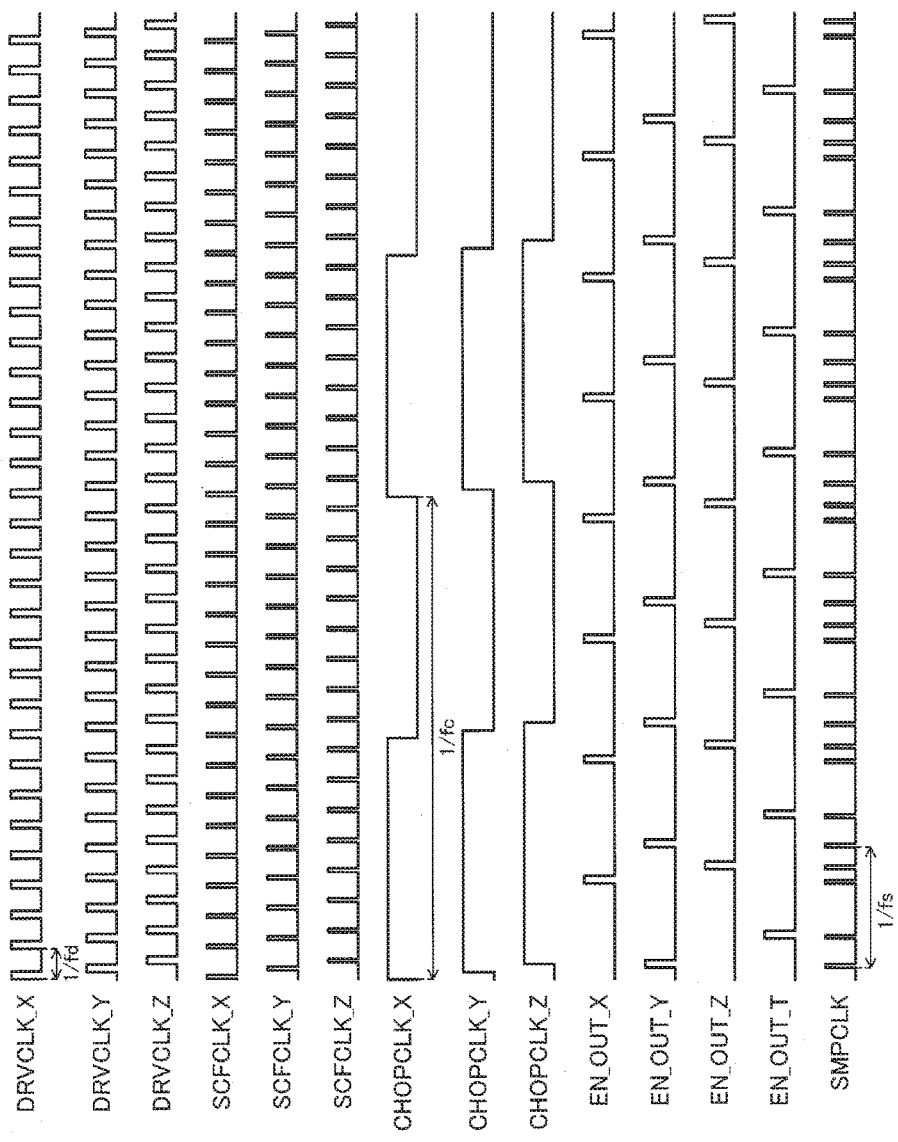
FIG. 12 is a diagram showing an example of signal waveforms of a variety of signals in the physical quantity detection circuit.

An example of the signal waveforms of the variety of signals in the physical quantity detection circuit 3 described hereinabove is shown in FIG. 11 and FIG. 12. As shown in FIG. 11 and FIG. 12, the frequency of the clock signals SCFCLK (SCFCLK_X, SCFCLK_X, and SCFCLK_Z) is the same as the frequency (the drive frequency fd) of the clock signals DRVCLK (DRVCLK_X, DRVCLK_Y, and DRVCLK_Z). Further, the sampling frequency fs is ¼ of the drive frequency fd, and the chopping frequency fc is 1/16 of the drive frequency fd.

It should be noted that in order to improve the detection accuracy of the physical quantity of the physical quantity detection device 1, it is desirable for the sampling frequency fs to be the frequency, which is equal to or lower than the drive frequency fd, and as high as possible in a range in which the A/D conversion circuit 70 can operate. Further, in order to improve the S/N ratio of the detection signal (the output signal of the digital filter 80) of the physical quantity by the physical quantity detection device 1, it is desirable for the chopping frequency fc to be a frequency equal to or lower than a half of the sampling frequency fs, and as high as possible. In reality, the sampling frequency fs and the chopping frequency fc are determined to be the optimum frequencies taking the trade-off between the limit of the operation speed of the circuit and the power consumption into consideration.

As described hereinabove, in the physical quantity detection device 1 (the physical quantity detection circuit 3) according to the present embodiment, the switched capacitor filter circuits 50X, 50Y, and 50Z each function as the anti-aliasing filter in the anterior stage of the A/D conversion circuit 70 due to the switched capacitor circuits 53P, 53N. Further, since the output signals of the switched capacitor filter circuits 50X, 50Y, and 50Z become the signals approximate to the DC signal due to the sample-and-hold circuits 51P, 51N, the degree of freedom of the sampling timing by the A/D conversion circuit 70 is high. Further, since the switched capacitor filter circuits 50X, 50Y, and 50Z operate on the differential signal pair POP, PON input thereto in a differential manner, the common-mode noise included in the differential signal pair POP, PON and the common-mode noise generated in the signal processing on the differential signal pair POP, PON are reduced. Therefore, according to the physical quantity detection device 1 (the physical quantity detection circuit 3) related to the present embodiment, it is possible to increase the drive frequency fd without changing the sampling frequency fs of the A/D conversion circuit 70, and thus, the reduction of noise can be achieved.

Further, in the physical quantity detection device 1 (the physical quantity detection circuit 3) according to the present embodiment, the signal component in the vicinity of the DC component included in the output signals of the sample-and-hold circuits 51P, 51N is converted by the chopping circuit 56 into the signal component in the vicinity of the chopping frequency fc in each of the switched capacitor filter circuit 50X, 50Y, and 50Z. Further, the signal component (the signal component converted by the chopping circuit 56) in the vicinity of the chopping frequency fc included in the output signal of the operational amplifier 57 is restored by the chopping circuit 58 to the signal component in the vicinity of the DC component, and the noise component (the 1/f noise generated by the operation of the operational amplifier 57) included in the output signal of the operational amplifier 57 is converted by the chopping circuit 58 into the noise component in the vicinity of the chopping frequency fc. Therefore, according to the physical quantity detection device 1 (the physical quantity detection circuit 3) related to the present embodiment, the noise component included in each of the output signals of the switched capacitor filter circuits 50X, 50Y, and 50Z is reduced, and thus, further reduction of noise can be achieved.

Further, in the physical quantity detection device 1 (the physical quantity detection circuit 3) according to the present embodiment, since the output signals of the switched capacitor filter circuits 50X, 50Y, and 50Z become the signals approximate to the DC signal, the degree of freedom of the sampling timing by the A/D conversion circuit 70 is high. Therefore, in the A/D conversion circuit 70, it is possible to perform the A/D conversion process of the output signals of the switched capacitor filter circuits 50X, 50Y, and 50Z and the output signal of the temperature sensor 40 in a time-sharing manner. Therefore, according to the present embodiment, it is possible to realize the physical quantity detection device 1 (the physical quantity detection circuit 3) capable of outputting the three-axis physical quantity detection signal and the temperature signal while preventing a dramatic increase in the circuit area.

2. Electronic Apparatus

Figure 13:
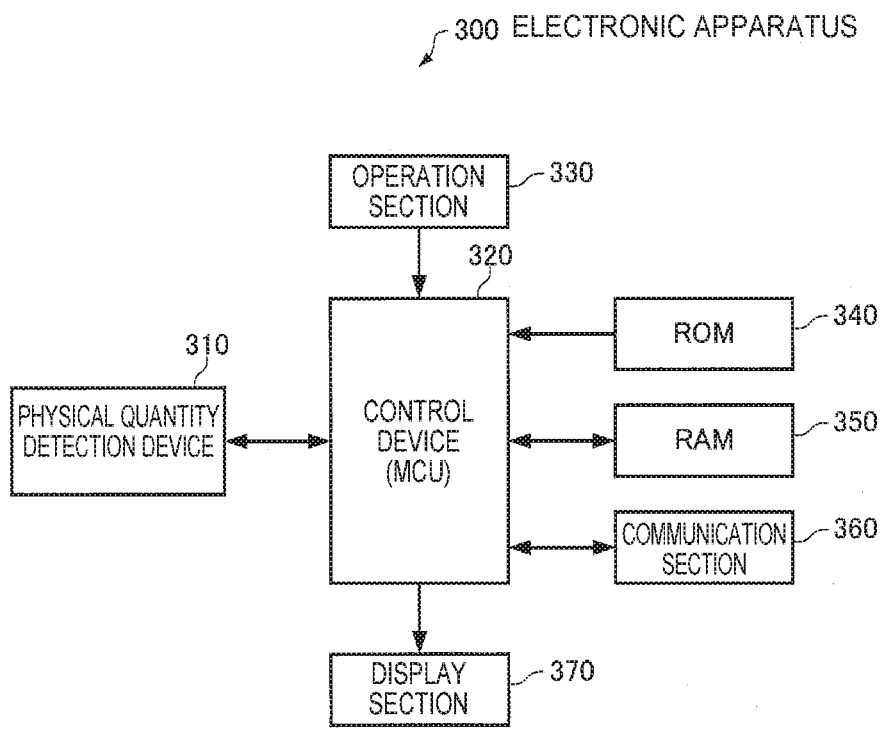
FIG. 13 is a functional block diagram showing an example of a configuration of an electronic apparatus according to an embodiment of the invention.

FIG. 13 is a functional block diagram showing an example of a configuration of an electronic apparatus according to the present embodiment. As shown in FIG. 13, the electronic apparatus 300 is configured including a physical quantity detection device 310, a control device (MCU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 13, or adding other constituents thereto.

The physical quantity detection device 310 is a device for driving a physical quantity detection element not shown, then generating a physical quantity signal based on the output signal of the physical quantity detection element, and then outputting the physical quantity signal thus generated, and can be an inertia measurement device for detecting at least a part of the physical quantities such as the acceleration, the angular velocity, the speed, the angular acceleration, and force, or can also be a tiltmeter for measuring the tilt angle. As the physical quantity detection device 310, it is possible to apply, for example, the physical quantity detection device 1 according to the present embodiment described above.

The control device (MCU) 320 transmits a communication signal to the physical quantity detection device 310, and performs a variety of arithmetic processing and control processing using the output data of the physical quantity detection device 310 in accordance with the program stored in the ROM 340 and so on. Besides the above, the control device (MCU) 320 performs a variety of processes corresponding to the operation signal from the operation section 330, a process of controlling the communication section 360 for performing data communication with external devices, a process of transmitting a display signal for making the display section 370 display a variety of types of information, and so on.

The operation section 330 is an input device constituted by operation keys, button switches, and so on, and outputs the operation signal corresponding to the operation by the user to the control device (MCU) 320.

The ROM 340 stores the programs, data, and so on for the control device (MCU) 320 to perform the variety of types of arithmetic processing and control processing.

The RAM 350 is used as a working area of the control device (MCU) 320, and temporarily stores, for example, the programs and the data retrieved from the ROM 340, the data input from the operation section 330, and the calculation result obtained by the control device (MCU) 320 performing operations in accordance with the variety of types of programs.

The communication section 360 performs a variety of types of control for establishing the data communication between the control device (MCU) 320 and the external devices.

The display section 370 is a display device formed of a liquid crystal display (LCD) or the like, and displays a variety of types of information based on the display signal input from the control device (MCU) 320. The display section 370 can also be provided with a touch panel, which functions as the operation section 330.

By applying, for example, the physical quantity detection device 1 according to the present embodiment described above as the physical quantity detection device 310, the reduction of noise can be achieved, and therefore, it is possible to realize the electronic apparatus high in reliability.

As such an electronic apparatus 300, a variety of electronic apparatuses can be adopted, and there can be cited, for example, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, an apparatus for a mobile terminal base station, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Figure 14:
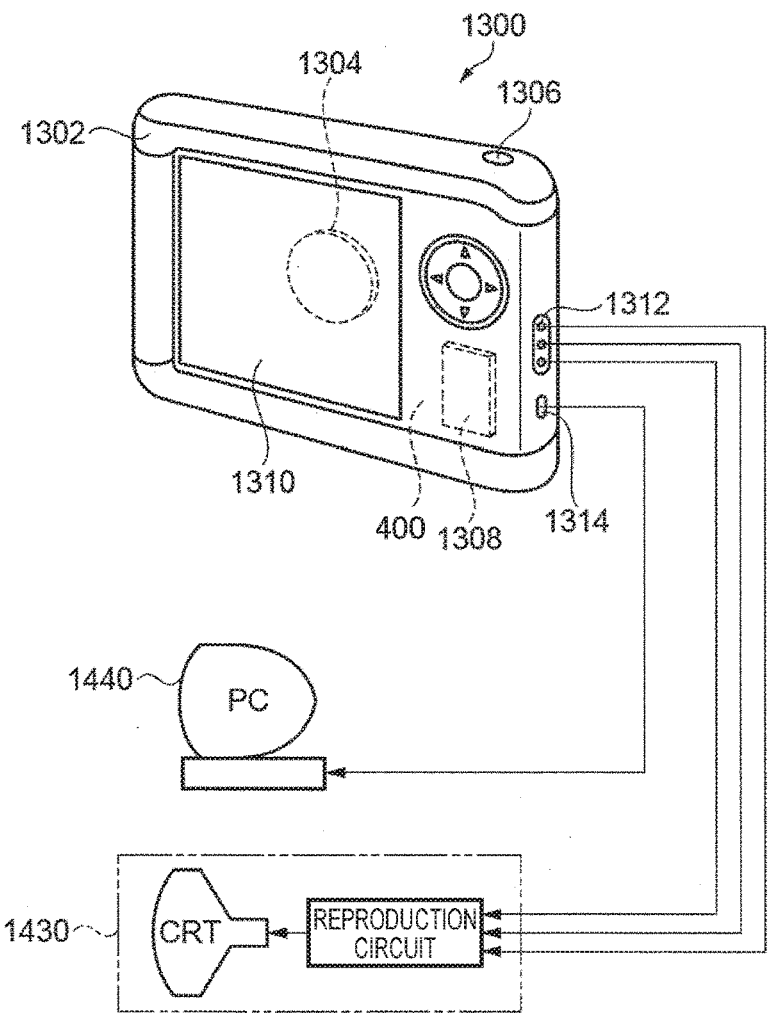
FIG. 14 is a perspective view schematically showing a digital camera as an example of the electronic apparatus.

FIG. 14 is a perspective view schematically showing a digital camera 1300 as an example of the electronic apparatus 300 according to the present embodiment. It should be noted that FIG. 14 also shows the connection with external equipment schematically. Here, typical cameras expose silver salt films to optical images of objects, while the digital camera 1300 performs photoelectric conversion on optical images of objects by imaging elements such as CCD (charge coupled device) to generate imaging signals (image signals).

A case (a body) 1302 of the digital camera 1300 is provided with the display section 1310 disposed on the back surface thereof to have a configuration of performing display in accordance with the imaging signal from the CCD, wherein the display section 1310 functions as a viewfinder for displaying the object as an electronic image. Further, the front surface (the back side in the drawing) of the case 1302 is provided with a light receiving unit 1304 including an optical lens (an imaging optical system), the CCD, and so on. When the photographer checks an object image displayed on the display section 1310, and then holds down a shutter button 1306, the imaging signal from the CCD at that moment is transferred to and stored in a memory device 1308. Further, the digital camera 1300 is provided with video signal output terminals 1312 and an input/output terminal 1314 for data communication disposed on a side surface of the case 1302. Further, a television monitor 1430 and a personal computer 1440 are connected to the video signal output terminals 1312 and the input/output terminal 1314 for data communication, respectively, according to needs. Further, there is adopted the configuration in which the imaging signal stored in the memory device 1308 is output to the television monitor 1430 and the personal computer 1440 in accordance with a predetermined operation. The digital camera 1300 has the physical quantity detection device 310, and performs a process such as image stabilization using the output data of the physical quantity detection device 310.

3. Vehicle

Figure 15:
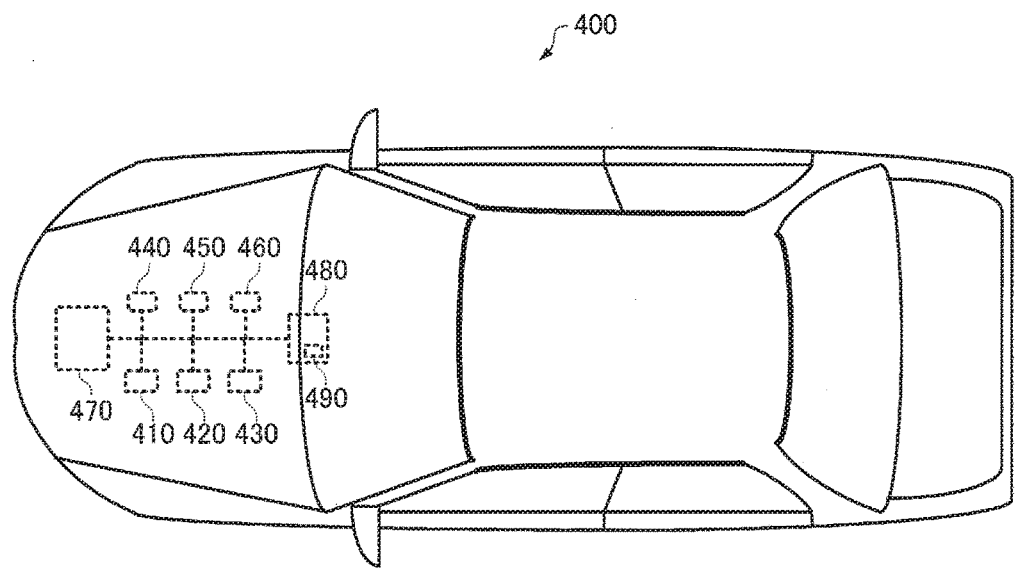
FIG. 15 is a diagram showing an example of a vehicle according to an embodiment of the invention.

FIG. 15 is a diagram (a top view) showing an example of a vehicle according to the present embodiment. The vehicle 400 shown in FIG. 15 is configured including physical quantity detection devices 410, 420, 430, controllers 440, 450, 460, a battery 470, and a navigation system 480. It should be noted that the vehicle according to the present embodiment can have a configuration obtained by eliminating some of the constituents (sections) shown in FIG. 15, or adding other constituents thereto.

The physical quantity detection devices 410, 420, 430, the controllers 440, 450, 460, and the navigation system 480 operate with the power supply voltage supplied by the battery 470.

The controllers 440, 450, 460 are control devices for transmitting the communication signals respectively to the physical quantity detection devices 410, 420, 430 to perform a variety of types of control such as an attitude control system, an overturn prevention system, and a braking system using the respective output data of the physical quantity detection devices 410, 420, 430.

The navigation device 480 displays a variety of types of information such as the location of the vehicle 400 and the time based on the output information of an embedded GPS receiver (not shown). Further, the navigation system 480 incorporates the physical quantity detection device 490, and performs calculation of the location and the orientation of the vehicle 400 based on the output signal of the physical quantity detection device 490 even in the case in which the GPS radio wave fails to reach the navigation system 480 to thereby continue the display of the necessary information.

The physical quantity detection devices 410, 420, 430, 490 are the devices of driving the physical quantity detection elements not shown to generate the physical quantity signals based on the output signals of the physical quantity detection elements, and then outputting the physical quantity signals, and are, for example, an acceleration sensor, an angular velocity sensor, a velocity sensor, and a tiltmeter, respectively.

By applying, for example, the physical quantity detection device 1 according to the embodiments described above as each of the physical quantity detection devices 410, 420, 430, 490, the reduction of noise can be achieved, and therefore, it is possible to realize the vehicle high in reliability.

As such a vehicle 400, there can be adopted a variety of types of vehicles, and there can be cited a car (including an electric car), an aircraft such as a jet plane or a helicopter, a ship, a boat, a rocket, an artificial satellite, and so on.

The invention is not limited to the present embodiment, but can be implemented with a variety of modifications within the scope or the spirit of the invention.

For example, in the embodiments described above the explanation is presented citing the physical quantity detection device (the acceleration detection device), the electronic apparatus, and the vehicle including the physical quantity detection element for detecting the acceleration as an example. However, the invention can also be applied to the physical quantity detection device, the electronic apparatus, and the vehicle including the physical quantity detection element for detecting a variety of physical quantities. The physical quantity to be detected by the physical quantity detection element is not limited to the acceleration, but can also be the angular velocity, the angular acceleration, the geomagnetism, the tilt, and so on. Further, as the material of the vibrator element of the physical quantity detection element, it is also possible to use a piezoelectric material such as a piezoelectric single crystal such as quartz crystal ($SiO_2$), lithium tantalate ($LiTaO_3$), or lithium niobate ($LiNbO_3$), or a piezoelectric ceramics such as lead zirconate titanate (PZT), or use a silicon semiconductor instead of the semiconductor material such as Si (silicon). Further, it is also possible to adopt a structure in which, for example, a piezoelectric thin film such as zinc oxide (ZnO) or aluminum nitride (AlN) sandwiched by drive electrodes is disposed in a part of the surface of the silicon semiconductor. Further, the physical quantity detection element is not limited to the capacitance type element, but can also be an element of a piezoelectric type, an electrodynamic type, an eddy-current type, an optical type, or a vibration type such as a strain gauge type. Alternatively, the type of the physical quantity detection element is not limited to the vibration type, but can also be, for example, an optical type, a rotary type, or a fluid type.

Further, for example, in each of the embodiments described above, the A/D conversion circuit 70 performs the A/D conversion process on the three-axis acceleration signals and the temperature signal in a time-sharing manner, but it is also possible to replace some of the signals with other physical quantity signals (e.g., an acceleration signal) and then perform the A/D conversion process thereon in a time-sharing manner, or it is also possible to add other physical quantity signals and then perform the A/D conversion process thereon in a time-sharing manner.

Further, for example, in each of the embodiments described above, the switched capacitor filter circuits 50X, 50Y, and 50Z operate on the differential signal pair POP, PON input thereto in a differential manner, but a single-ended signal can be input, and it is not required for the switched capacitor filter circuits 50X, 50Y, and 50Z to operate in a differential manner.

The embodiments and the modified examples described above are illustrative only, and the invention is not limited to the embodiments and the modified examples. For example, it is also possible to arbitrarily combine any of the embodiments and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations providing the same functions and advantages and configurations capable of achieving the same object as the configuration described as the embodiment of the invention. Further, the invention includes configurations obtained by adding known technologies to the configuration described as one of the embodiments of the invention.

The entire disclosure of Japanese Patent Application No. 2016-140347, filed Jul. 15, 2016 is expressly incorporated by reference herein.

What is claimed is:

1. A physical quantity detection circuit comprising:
    a switched capacitor filter circuit having a first sample-and-hold circuit adapted to sample and hold a first signal, which is based on an output signal of a physical quantity detection element, an amplifier circuit to which an output signal of the first sample-and-hold circuit is input, and a first switched capacitor circuit to which a first output signal of the amplifier circuit is input, wherein an output signal of the first switched capacitor circuit is input to the amplifier circuit; and
    an A/D conversion circuit adapted to perform an A/D conversion on an output signal of the switched capacitor filter circuit,
    wherein the A/D conversion circuit performs the A/D conversion on a plurality of signals including an output signal of the switched capacitor filter circuit in a time-sharing manner.

2. The physical quantity detection circuit according to claim 1, wherein
    the amplifier circuit includes:
        a first chopping circuit to which an output signal of the first sample-and-hold circuit is input,
        an operational amplifier to which an output signal of the first chopping circuit is input, and
        a second chopping circuit to which an output signal of the operational amplifier is input.

3. The physical quantity detection circuit according to claim 2, wherein
    chopping frequencies in the first chopping circuit and the second chopping circuit are equal to or lower than a half of a sampling frequency with which the A/D conversion circuit samples an output signal of the switched capacitor filter circuit.

4. The physical quantity detection circuit according to claim 2, further comprising:
    a drive circuit adapted to generate a drive signal for driving the physical quantity detection element based on a first clock signal,
    wherein the switched capacitor filter circuit has a frequency divider circuit adapted to divide a frequency of the first clock signal to generate a second clock signal, and
    the first chopping circuit and the second chopping circuit operate based on the second clock signal.

5. The physical quantity detection circuit according to claim 1, wherein
    the switched capacitor filter circuit includes
        a second sample-and-hold circuit adapted to sample and hold a second signal, which is based on the output signal of the physical quantity detection element, and
        a second switched capacitor circuit to which a second output signal of the amplifier circuit is input,
    an output signal of the first sample-and-hold circuit and an output signal of the second sample-and-hold circuit are input to the amplifier circuit, and the amplifier circuit operates on the first signal and the second signal in a differential manner.

6. A physical quantity detection device comprising:
the physical quantity detection circuit according to claim 1; and
a physical quantity detection element.

7. A physical quantity detection device comprising:
the physical quantity detection circuit according to claim 2; and
a physical quantity detection element.

8. A physical quantity detection device comprising:
the physical quantity detection circuit according to claim 3; and
a physical quantity detection element.

9. A physical quantity detection device comprising:
the physical quantity detection circuit according to claim 4; and
a physical quantity detection element.

10. An electronic apparatus comprising:
the physical quantity detection device according to claim 6.

11. An electronic apparatus comprising:
the physical quantity detection device according to claim 7.

12. An electronic apparatus comprising:
the physical quantity detection device according to claim 8.

13. An electronic apparatus comprising:
the physical quantity detection device according to claim 9.

14. A vehicle comprising:
the physical quantity detection device according to claim 6.

15. A vehicle comprising:
the physical quantity detection device according to claim 7.

16. A vehicle comprising:
the physical quantity detection device according to claim 8.

17. A vehicle comprising:
the physical quantity detection device according to claim 9.

* * * * *